(12) United States Patent
Beffa (10) Patent No.: US 10,200,014 B2
(45) Date of Patent: Feb. 5, 2019

(54) RECEIVER, COMMUNICATION UNIT, AND METHOD FOR DOWN-CONVERTING A RADIO FREQUENCY SIGNAL

(71) Applicant: MEDIATEK Singapore Pte. Ltd., Singapore (SG)

(72) Inventor: Federico Alessandro Fabrizio Beffa, Fescoggia (CH)

(73) Assignee: MediaTek Singapore Pte. Ltd., Solaris (SG)

( * ) Notice: Subject to any disclaimer, the term of this patent is extended or adjusted under 35 U.S.C. 154(b) by 0 days.

(21) Appl. No.: 15/205,170

(22) Filed: Jul. 8, 2016

(65) Prior Publication Data
US 2017/0012655 A1    Jan. 12, 2017

Related U.S. Application Data

(60) Provisional application No. 62/189,940, filed on Jul. 8, 2015, provisional application No. 62/192,142, filed on Jul. 14, 2015.

(51) Int. Cl.
*H03H 15/00* (2006.01)
*G06F 17/11* (2006.01)
(Continued)

(52) U.S. Cl.
CPC ........... *H03H 15/023* (2013.01); *G06F 17/11* (2013.01); *H03H 15/00* (2013.01);
(Continued)

(58) Field of Classification Search
CPC .... H03H 15/023; H03H 19/004; H03H 15/00; H03H 21/0023; H04B 1/28;
(Continued)

(56) References Cited

U.S. PATENT DOCUMENTS

2007/0211511 A1* 9/2007 Kane ................... G11C 11/5692
365/100
2009/0322418 A1    12/2009 Burke
(Continued)

FOREIGN PATENT DOCUMENTS

DE    2063253 A1    7/1972
FR     88109 E      4/1966

OTHER PUBLICATIONS

Choi et al., "A Programmable Discrete-Time Filter Employing Hardware-Efficient Two-Dimensional Implementation Method," IEEE Asian Solid-State Circuits Conference, Nov. 12, 2014.*
(Continued)

*Primary Examiner* — Michelle M Koeth
(74) *Attorney, Agent, or Firm* — Optimus Patents US, LLC (57) ABSTRACT

There is provided a communication receiver comprising: an input for receiving a radio frequency, RF, input signal; and at least one finite impulse response, FIR, discrete time filter, DTF. The at least one FIR DTF comprises: an input circuit comprising an input port for sampling the RF input signal at a sampling frequency that is comparable to the input RF input signal; and N parallel branches, each branch having a set of input unit sampling capacitances, where each unit sampling capacitance is independently selectively couple-able to an output summing node. The input circuit is configured to convert an equivalent input impedance of the at least one FIR DTF around the sampling frequency to a real impedance.

20 Claims, 7 Drawing Sheets

(51) Int. Cl.
  *H03H 21/00*    (2006.01)
  *H04B 1/00*    (2006.01)
  *H04B 1/26*    (2006.01)
(52) U.S. Cl.
  CPC ....... *H03H 21/0023* (2013.01); *H04B 1/0014* (2013.01); *H04B 1/0017* (2013.01); *H04B 1/26* (2013.01)
(58) Field of Classification Search
  CPC ...... H04B 1/0014; H04B 1/0017; H04B 1/26; G06F 17/11; H03D 2200/006
  See application file for complete search history.

(56) References Cited

U.S. PATENT DOCUMENTS

| | | | |
|---|---|---|---|
| 2010/0167685 A1* | 7/2010 | Burke | H04B 1/28 455/341 |
| 2013/0028362 A1 | 1/2013 | Rofougaran et al. | |
| 2016/0329931 A1* | 11/2016 | Mukherjee | H04B 5/0012 |

OTHER PUBLICATIONS

Advanced Energy Industries, Inc. "Impedance Matching," 2006, (available at: "http://www.advanced-energy.com/upload/file/white_papers/eng-white18-270-02.pdf," last accessed Apr. 24, 2017).*

R. Bagheri et al., "An 800-MHz-6-GHz Software-Defined Wireless Receiver in 90-nm CMOS," in IEEE Journal of Solid-State Circuits, vol. 41, No. 12, pp. 2860-2876, Dec. 2006.*

M. F. Huang et al., "A 58.9-dB ACR, 85.5-dB SBA, 5-26-MHz Configurable-Bandwidth, Charge-Domain Filter in 65-nm CMOS," in IEEE Journal of Solid-State Circuits, vol. 48, No. 11, pp. 2827-2838, Nov. 2013.*

Duipmans Lammert el al "Analysis of the Signal Transfer and Folding in N-Path Filters With a Series Inductance". IEEE Transactions on circuits and systems I: Regular papers, IEEE, US, vol. 62. No. 1, Jan. 1, 2015 pp. 263-272, XP011569525 ISSN: 1549-8328, D01.

* cited by examiner

RECEIVER, COMMUNICATION UNIT, AND METHOD FOR DOWN-CONVERTING A RADIO FREQUENCY SIGNAL

FIELD OF THE INVENTION

The field of this invention relates to a receiver and a communication unit comprising a receiver having a discrete time filter and method for receiving and down-converting a radio frequency signal therein.

BACKGROUND OF THE INVENTION

A primary function of a wireless receiver is to down-convert the received wanted radio frequency signal to a baseband and/or digital form in order to process the wanted signal. In order to selectively extract the wanted signal from noise or other undesired signals, filters are used. Filters are employed at various stages of a receiver's architecture, from analog radio frequency (RF) filters through to digital filters. A digital filter operates on a discrete time sample set, where the value of the samples has been rounded to the nearest value from a finite set of possible values, typically represented as a binary number.

An analog discrete time filter (DTF) operates on a discrete time sample set, where the value of the samples is continuous (typically a real number), and where digitization occurs in an analog-to-digital converter (ADC) located after this filter. DTFs have two forms, i.e. Finite Impulse Response (FIR) and Infinite Impulse Response (IIR). In receivers having FIR DTFs, it is known that sampling capacitances need to be accurately matched.

Figure 1:
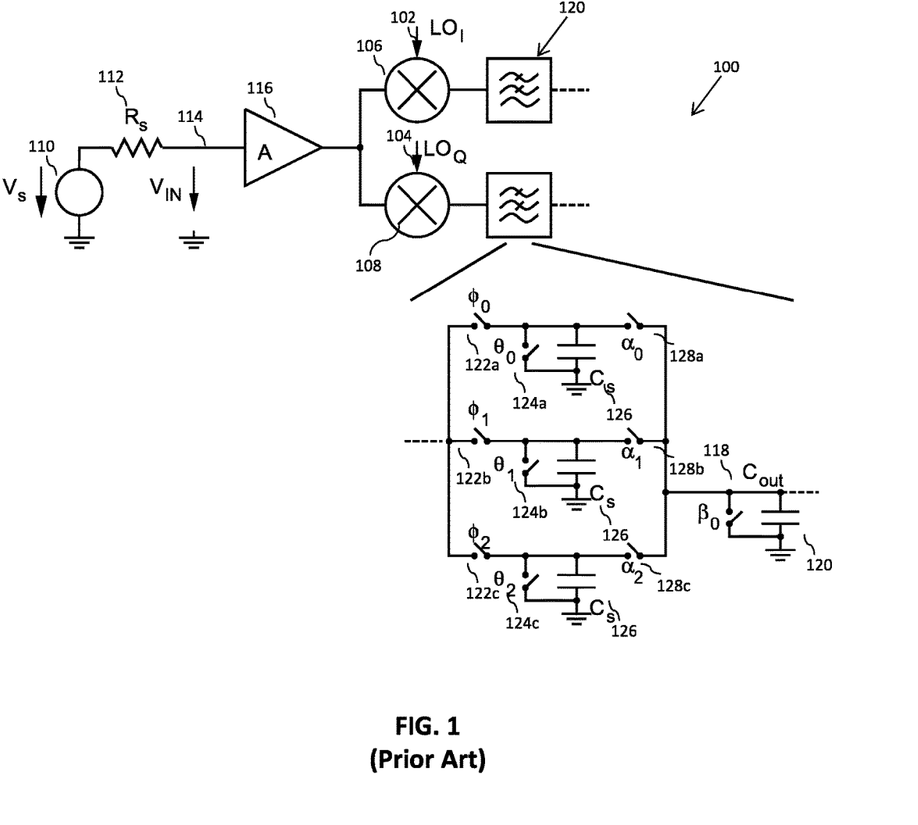
FIG. 1 illustrates a known example of a receiver making use of FIR discrete time filter (DTF) to implement the baseband channel filter.

Referring now to FIG. 1, a known example of a receiver 100 with a baseband decimate-by-2 (or higher order decimating) FIR discrete time filter 120 is illustrated. The receiver 100 includes a source voltage 110 coupled via a source resistance 112 to an input port 114, which represents an input radio frequency signal. The equivalent input radio frequency signal is input to a low-noise amplifier (LNA) 116. The output from the low-noise amplifier 116 is input to a quadrature down-mixers 106, 108 that down-converts the (equivalent) input radio frequency signal to a baseband signal in response to quadrature local oscillator (LO) signals being applied to the quadrature down-mixer 106, 108.

The quadrature baseband outputs from the quadrature down-mixers 106, 108 are input to a baseband filter network, which is illustrated in a form of an N-branch parallel discrete time filter 120.

A full filter is made of N-branches, but each branch does not form a full filter by itself, just a sampling capacitor Cs or, in general, a set of sampling capacitors Cs. The N-branch parallel discrete time filter includes source capacitors Cs 126 in each branch. Control of the N branches of FIR DTFs is typically implemented by means of transistor switches with small conducting resistances $R_{ON}$. In this manner, sampling capacitors Cs 126 in each branch are selectively coupled to the input by a set of respective switches ($\phi 0$, $\phi 1$, $\phi 2$) 122. The sampling capacitors Cs 126 in each branch are selectively coupled to the output by a further set of respective switches ($\alpha 0$, $\alpha 1$, $\alpha 2$) 128. The sampling capacitors Cs 126 in each branch are selectively reset by a further set of respective switches ($\theta 0$, $\theta 1$, $\theta 2$) 124. The outputs from the N-branches are then combined (summed) and coupled to an output capacitor (Cout) 120 to provide an output voltage Vout from the decimate-by-2 FIR discrete time filter 100.

The charge of the output capacitor (Cout) 120 is selectively maintained or discharged by means of an output capacitor reset switch 118 ($\beta 0$).

The N-branch parallel discrete time filter 120 in FIG. 1, in a form of a Finite Impulse Response (FIR) filter, is not suitable as a radio frequency (RF) input stage for a receiver due to it's reactive input termination and large input noise bandwidth. Thus, DTFs, whilst able to naturally perform down-conversion (aliasing), fail to provide a well-defined, real, input termination at frequencies around the sampling frequency. In addition, they generally add a substantial amount of noise by folding noise around harmonics of the sampling frequency on top of the wanted signal (aliasing). Hence, for these reasons discrete time filters are currently not used as the first stage of communication receivers, i.e. as a low noise filter located prior to the (analog) LNA 116.

The analogue circuits (LNA, mixer) used as the first few stages of communication receivers limit the achievable linearity of the receiver. This is because of the non-linear characteristic of the devices used to implement them (generally, transistors) and because the high operating frequency limits the use of analogue linearization techniques such as feedback. In addition the power consumption of the input analogue circuits is usually a sizable fraction of the total power consumption of the receiver.

Thus, a need exists for an improved circuit design that could allow DTFs to be used in the RF circuits of receivers.

SUMMARY OF THE INVENTION

Accordingly, the invention seeks to mitigate, alleviate or eliminate one or more of the above mentioned disadvantages singly or in any combination. Aspects of the invention provide a communication receiver, a communication unit and a method down conversion of a radio frequency signal in a communication receiver as described in the appended claims.

According to a first aspect of the invention, there is provided a communication receiver comprising: an input for receiving a radio frequency, RF, input signal; and at least one finite impulse response, FIR, discrete time filter, DTF. The at least one FIR DTF comprises: an input circuit comprising an input port for sampling the RF input signal at a sampling frequency that is comparable to the input RF input signal; and N parallel branches, each branch having a set of input unit sampling capacitances, where each unit sampling capacitance is independently selectively coupleable to an output summing node. The input circuit is configured to convert an equivalent input impedance of the at least one FIR DTF around the sampling frequency to a real impedance.

Advantageously, and as described in greater detail below, a known problem of DTFs is resolved by use of a sampling frequency that is comparable to the input RF input signal for the DTF an input circuit that is configured to convert an equivalent input impedance of the at least one FIR DTF around the sampling frequency to a real impedance. In this manner, the FIR DTF is configured to be able to perform both input termination of the input RF signal as well as down conversion and filtering of the RF signal. In this manner, the DTF can therefore be used as the first stage of a communication receiver.

According to some optional embodiments, the at least one DTF may be configured to directly perform down conversion of the RF input signal.

In some examples, the input circuit may comprises a parallel input shunt inductance to resonate a reactive part of the equivalent input impedance around the sampling frequency. In some examples, the input circuit may comprise a network of radio frequency components configured to resonate a reactive part of the equivalent input impedance around the sampling frequency.

According to some optional embodiments, the sampling capacitances of each of the N parallel branches, may be linear passive capacitors such that the input signal is sampled across multiple linear passive capacitors. In this manner, the DTF operates by sampling the input signal across linear passive capacitors, and therefore possesses better linearity characteristics than analogue RF amplifiers and mixers that are used in conventional receivers.

According to some optional embodiments, the sampling capacitances of each of the N parallel branches may be Metal-Oxide-Semiconductor (MOS) capacitors. In this manner, a higher capacitance density may be achieved, thus occupying less area (and incurring less cost) when compared to Metal-Oxide-Metal (MOM) or Metal-Insulator-Metal (MIM) capacitors.

According to some optional embodiments, the at least one FIR DTF may comprise multiple FIR DTFs connected in parallel each one with their respective input port connected to receive the same RF input signal. In some examples, the multiple FIR DTFs may be configured to filter samples of the same RF input signal at the same sampling frequency, but at interleaved time instants. In some examples, the multiple FIR DTFs may comprise two FIR DTFs configured to act on quadrature representations of the RF input signal.

According to a second aspect of the invention, there is provided a communication unit comprising a communication receiver having: an input for receiving a radio frequency, RF, input signal; and at least one finite impulse response, FIR, discrete time filter, DTF. The at least one FIR DTF comprises: an input circuit comprising an input port for sampling the RF input signal at a sampling frequency that is comparable to the input RF input signal; and N parallel branches, each branch having a set of input unit sampling capacitances, where each unit sampling capacitance is independently selectively coupleable to an output summing node. The input circuit is configured to convert an equivalent input impedance of the at least one FIR DTF around the sampling frequency to a real impedance.

According to a third aspect of the invention, there is provided a method of down conversion of a radio frequency signal in a communication receiver comprising a finite impulse response, FIR, discrete time filter, DTF that comprises an input coupled to N parallel branches, each branch having a set of input unit sampling capacitances. The method comprises: receiving a radio frequency, RF, input signal; converting an equivalent input impedance of the at least one FIR DTF around a sampling frequency to a real impedance; sampling, at an input of the at least one FIR DTF, the RF input signal at the sampling frequency, wherein the sampling frequency is comparable to the input RF input signal; and independently selectively coupling a set of unit sampling capacitances to an output summing node of the FIR DTF to provide a frequency down-converted signal.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

Examples of the invention will be described in terms of a hardware-based discrete-time filter design. However, it will be appreciated by a skilled artisan that the inventive concept herein described may be embodied in any type of discrete-time filter design, e.g. software, firmware or any combination thereof. Although examples of the invention are described with reference to a DTF for a wireless communication unit, it is envisaged that the disclosed DTF may be applied to a multitude of everyday electronic components and products, such as mobile radios, radio receivers, audio-video receivers, etc.

In accordance with some example embodiments of the invention, the inventor has recognized and appreciated that switching transients are a major contributor in creating the real part of the input impedance for a radio frequency filter, particularly a finite impulse response (FIR) discrete time filter that could be designed to function as a radio frequency filter.

A communication receiver is described that comprises an input for receiving a radio frequency, RF, input signal; and at least one finite impulse response, FIR, discrete time filter, DTF. The at least one FIR DTF comprises an input circuit comprising an input port for sampling the RF input signal at a sampling frequency that is comparable to the input RF input signal; and N parallel branches, each branch having a set of input unit sampling capacitances, where each unit sampling capacitance is independently selectively coupleable to an output summing node. The input circuit is configured to convert an equivalent input impedance of the at least one FIR DTF around the sampling frequency to a real impedance.

Advantageously, and as described in greater detail below, a known problem of DTFs is resolved by use of a sampling frequency that is comparable to the input RF input signal for the DTF an input circuit that is configured to convert an equivalent input impedance of the at least one FIR DTF around the sampling frequency to a real impedance. In this manner, the FIR DTF is configured to be able to perform both input termination of the input RF signal as well as down conversion and filtering of the RF signal. In this manner, the DTF can therefore be used as the first stage of a communication receiver.

In accordance with some example embodiments of the invention, the input circuit includes a shunt inductance to convert an equivalent input impedance of the at least one FIR DTF around the sampling frequency to a real impedance. The introduction of an input shunt inductor also limits the input noise bandwidth, thereby improving the FIR filter noise figure (NF). In this manner, the use of a shunt inductor connected to the sampled input node of an FIR filter facilitates achieving a real, well-controlled input impedance around the sampling frequency, as well as reduces the NF of the FIR filter by reducing aliasing and additionally enables a RF-based FIR discrete time filter to perform down-conversion of an RF input signal.

Also, and beneficially in accordance with some examples, as the input signal is sampled across linear passive capacitors, the linearity of the receiver is improved and power consumption may be reduced.

Figure 2:
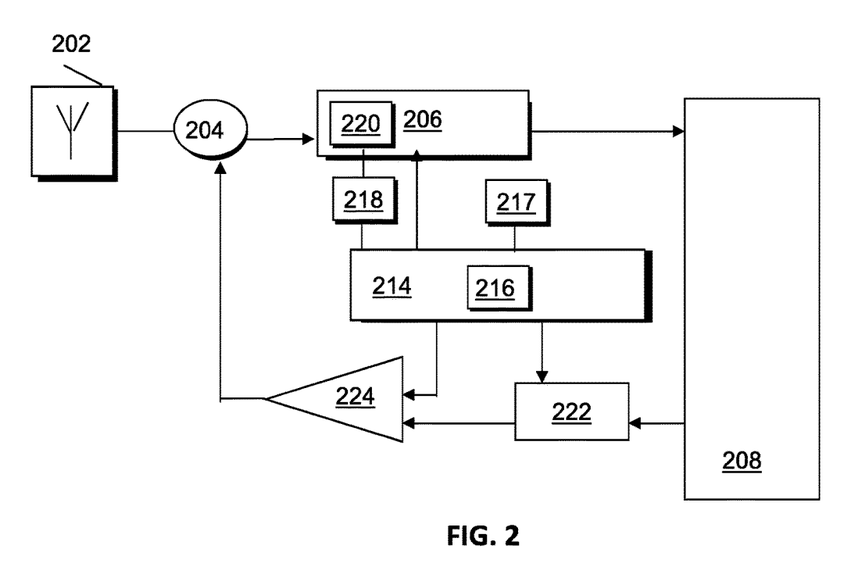
FIG. 2 schematically illustrates a simplified example of a part of a wireless communication unit, in accordance with examples of the invention.

Referring now to FIG. 2, there is illustrated a simplified block diagram of a wireless communication unit 200, adapted in accordance with some example embodiments of the invention, is shown. In practice, purely for the purposes of explaining embodiments of the invention, the wireless communication unit is described in terms of a wireless subscriber communication unit, such as a user equipment (UE) that in some examples may be a smartphone. In other examples, any wireless device with a processor or circuit arranged to perform discrete time filtering may be used.

The wireless communication unit 200 contains an antenna arrangement 202, for radiating or receiving transmissions, coupled to an antenna switch or duplexer 204 that provides isolation between receive and transmit chains within the wireless communication unit 200.

As known in the art, one or more receiver chains is/are coupled to antenna switch or duplexer 204 and include(s) receiver front-end circuitry 206 (effectively providing reception, filtering and intermediate or base-band frequency conversion). The receiver front-end circuitry 206 is coupled to a signal processing module 208 (generally realized by a digital signal processor (DSP)). A skilled artisan will appreciate that the level of integration of receiver circuits or components may be, in some instances, implementation-dependent.

A controller 214 maintains overall operational control of the wireless communication unit 200. The controller 214 is coupled to the receiver front-end circuitry 206 and the signal processing module 208. In some examples, the controller 214 comprises or is also coupled to a clock generator 217 and/or a memory device 216 that selectively stores operating regimes, and the like. A timer 218 is operably coupled to the controller 214 to control the timing of operations (e.g. transmission or reception of time-dependent signals) within the wireless communication unit 200. The transmit chain includes transmitter/modulation circuitry 222 and a power amplifier 224 coupled to the antenna arrangement 202, which may comprise for example an antenna array, or plurality of antennas. The transmitter/modulation circuitry 222 and the power amplifier 224 are operationally responsive to the controller 214.

In this example, a FIR discrete time filter, DTF, 220, is located in the receiver front-end circuitry 206 and is configured with a shunt inductance located at its input. The input RF signal is sampled at a sampling frequency that is comparable to the input RF frequency.

As the sampling frequency is 'comparable' to the input RF frequency, the behaviour is similar to that for a typical mixer, namely for an input signal carrier frequency $f_{RF}$ and a sampling (LO) frequency $f_s$, the output intermediate frequency signal is $f_{IF}=|f_{RF}-f_s|$. In some examples, it was determined that a useful type of FIR DTF, for a reasonably practical implementation, provided a low-pass characteristic. Hence, in some examples $f_{IF}$ is advantageously made '0'. In some examples, a difference between the sampling frequency and the input RF frequency may be tolerated, dependent upon the actual filter transfer function, as part of the signal may still be filtered. In this regard, a tolerance of, say, $f_{IF}/f_s<0.1$ may be acceptable. As such, the term 'comparable' used herein and when referring to the sampling frequency and the input RF frequency, encompasses such a tolerance.

The DTF then performs a decimation and the output sampled data signal has a sample rate which is a fraction of the input side sampling frequency. The FIR DTF 220 includes N parallel branches, each branch having a set of input unit sampling capacitances where each unit sampling capacitance is independently selectively coupleable to the summing node; and an output capacitance connected to the summing node. In some examples, the output capacitance may be an input capacitance of a following stage.

In accordance with some example embodiments of the invention, the inventor recognized that, for the example classes of passive DTF described here, the input impedance around the sampling frequency may, to a reasonable approximation, be represented by an equivalent resistance in parallel with an equivalent capacitance. The reactive part of the equivalent input impedance of the DTF may be suppressed with the help of a parallel input shunt inductor, as with traditional, continuous-time circuits. Thus, in this manner, the introduction of a parallel input shunt inductance may convert the equivalent input impedance of the DTF around the sampling frequency to a real, well-controlled input impedance. The introduction of a parallel input shunt inductor also limits the input noise bandwidth, thereby improving the FIR DTF noise figure (NF).

In some examples, the timer 218 includes a clock generator configured to generate and apply a sampling frequency to the sampling capacitances of the FIR DTF 220 that is comparable to the input RF carrier frequency. In this manner, the speed of the switching/sampling applied to the switches of the discrete time filter is consistent with the input RF carrier frequency. In this manner, the FIR DTF 220 is capable of directly performing down conversion of the input radio frequency signal.

Also, and beneficially in accordance with some examples, as the input signal is sampled across linear passive capacitors of the FIR DTF 220, the linearity of the receiver is improved and power consumption reduced.

In integrated circuits it is desirable to use Metal-Oxide-Semiconductor (MOS) capacitors, despite MOS capacitors being known to have a non-linear charge-voltage (C-V) characteristic. Nevertheless, in accordance with some example embodiments, it is envisaged that the higher capacitance density provided MOS capacitors may be beneficially used in some implementations of the present invention, as MOS capacitors occupy less area (translating to less cost) when compared to Metal-Oxide-Metal (MOM) or Metal-Insulator-Metal (MIM) capacitors.

Figure 3:
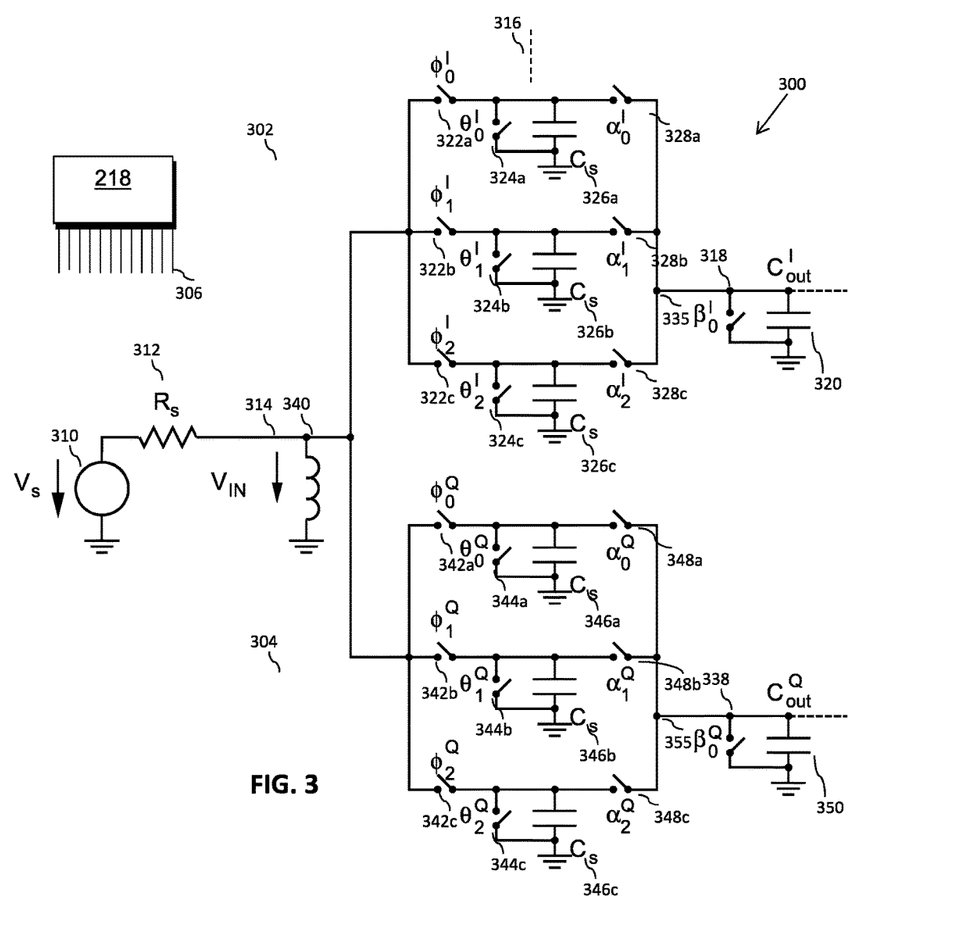
FIG. 3 illustrates a simplified circuit diagram of an example of a 2-path network consisting of an in-phase 'I' and a quadrature 'Q' FIR DTF, in accordance with examples of the invention.

Referring now to FIG. 3, an example of a decimate-by-2 FIR DTF 300 adapted in accordance with example embodiments of the invention is illustrated. The decimate-by-2 FIR DTF 300 includes a source voltage 310 coupled via a source resistance 312 to an input port 314 receiving an input voltage, which represents an input radio frequency signal. The FIR DTF circuit includes an input port for receiving an analogue continuous time RF signal to be sampled, and one or several clock input ports to receive timing signals. The continuous time RF input signal is sampled by connecting it (through switches $\varphi_i$) to sampling capacitors for a fraction of the sampling period $T_s=1/f_s$. During this time a current can flow from the source of the signal into the capacitor, thereby charging it to a voltage asymptotically converging toward the input signal value.

In accordance with examples of the invention, a shunt inductance 340 converts the input impedance of the FIR DTF 300 around the sampling frequency to a real, well-controlled input impedance around the sampling frequency. The introduction of an input shunt inductor 340 also limits the input noise bandwidth, thereby improving the FIR filter NF. These characteristics make the circuit usable as the first stage of a communication receiver. A skilled artisan will recognized and appreciate that the introduction of inductor 340 is different to implementing matching inductors in conventional receivers, as the inductor 340 is connected to the input sampled node of a discrete time circuit.

In this example, in order to implement a quadrature receiver structure, an N-branch parallel network 316 is divided into separate ('I' and 'Q') quadrature down-converting FIR filter sections 302, 304, in order to filter the received RF signal and down-convert the filtered RF signal to a baseband quadrature form. In this manner, the two quadrature down-converting FIR filter sections 302, 304 advantageously replace the two traditional down-converting mixers.

The N-branch parallel network 316 includes a first quadrature 'I' section 302 that includes sampling capacitors Cs 326a, 326b, 326c in each branch. Control of the N branches of the FIR DTFs is typically implemented by means of transistor switches with small conducting resistances $R_{ON}$. In this manner, sampling capacitors Cs 326 in each branch are selectively coupled to the input by a set of respective input switches 322a ($\phi$0), 322b ($\phi$1), 322c ($\phi$2). The sampling capacitors Cs 326a, 326b, 326c in each branch are selectively coupled to the output by a further set of respective output switches 328a ($\alpha$0), 328b ($\alpha$1), 328c ($\alpha$2). The sampling capacitors Cs 326a, 326b, 326c in each branch are selectively reset by a further set of respective reset switches 324a ($\theta$0), 324b ($\theta$1), 324c ($\theta$2). The outputs from a set of the N-branch parallel network 316 are then combined (summed) in summing junction 335 and coupled to an output capacitor ($C_{out}$) 320 to provide an output voltage Vout from the decimate-by-2 FIR discrete time filter 300. The charge of the output capacitor ($C_{out}$) 320 is selectively maintained or discharged by means of an output capacitor reset switch 318 $\beta$0). In this example, decimate-by-2 FIR DTF, constructs an output sample value using two out of three sampling capacitors Cs 326 left over are connected to the output.

The N-branch parallel network 316 includes a second quadrature 'Q' section 304 that is a second, substantially identical instance of the first FIR DTF 302. The only difference between the 'I' section 302 and the 'Q' section 304 is that the control signals driving the 'Q' instance of the filter are all shifted by of the input sampling frequency as compared to the control signals of the 'I' filter. In general it may be advantageous to use P instances of the same FIR DTF in parallel, with their inputs all connected to the same input node and a shunt inductor. In this case, if the input sampling frequency is $f_s$, then filter p should ideally be connected to the input during a time interval of $T_s=T_s/P$ at times:

$$t_p = p*T_s + i*T_s + t_{offset}, \quad i=0,1,2,\ldots \quad [1]$$

with $T_s=1/f_s$, $t_{offset}$ being an arbitrary offset time and p=0, ..., P−1.

In practical implementations, in some examples and to avoid overlapping between the sampling times of different filters, the interval T may be made somewhat smaller (say 90%) than its ideal value.

Ideally, in accordance with some examples, the input voltage is sampled independently from the previous charge that resided on the sampling capacitor Cs. Hence, in some examples, the reset switches may optionally enable the sampling capacitors Cs 342a, 342b, 342c to be discharged before re-charging.

In some examples, typical values will range from, say, 1 nH to a few dozens of nH, depending upon the value of the sampling capacitor and of the sampling frequency.

In accordance with some examples, the timer 218 includes a clock generator configured to generate and apply multiple switching control signals 306 to the multiple switches controlling the charge distribution on the sampling capacitances of the FIR DTF 220. In particular, the sampling frequency of the multiple switching control signals 306 applied to the input side switches of the discrete time filter is comparable to the input RF carrier frequency (noting that, on the output side, decimation is performed and the sampling frequency becomes fs/R). The application of the multiple switching control signals 306 to the switches, thereby controlling the charge distribution on the sampling capacitances, allows the discrete time filter to directly perform down conversion.

It can be shown that, around the input frequency $f_s$, the input impedance $Z_1$ is (with $\tau=r_{on}C$, $T=1/f_s$ and C the value of the sampling capacitor):

$$Z_1 = \frac{1}{\frac{jw_sC/2}{1+jw_s t} + \frac{C}{T}\frac{1+e^{-T/(2t)}}{(1+jw_s t)^2}} \xrightarrow{w_s t \ll 1} Z_1 \approx \frac{1}{jw_s\frac{C}{2} + \frac{C}{T}} \quad [2]$$

Thus, the FIR DTF with a suitably selected sampling frequency has an input impedance that, around the sampling frequency, can be approximated as the parallel connection of a capacitor and a resistor. In some examples, the addition of a shunt inductor in parallel with the sampled input port of the filter resonates the reactive part of the input impedance. In effect, this removes the imaginary part from the denominator of equation [2] thereby resulting in a real input impedance. In addition, the shunt inductor, limits the input noise bandwidth, and thereby improves the NF of the FIR filter.

Figure 4:
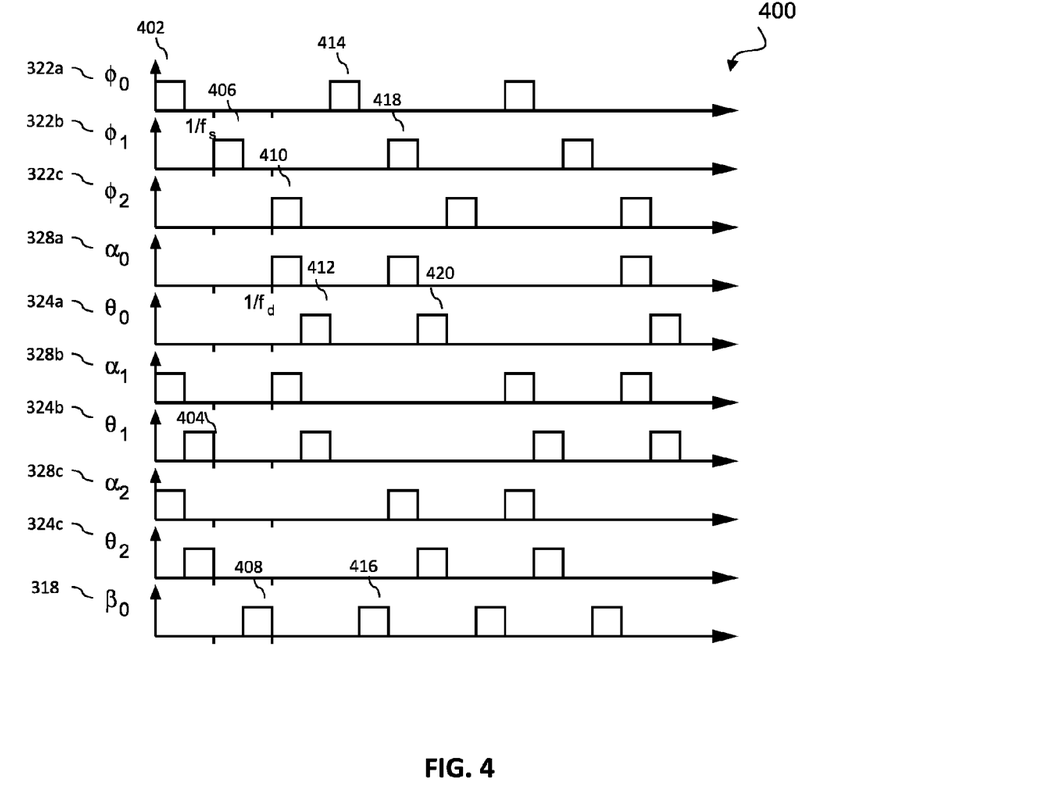
FIG. 4 illustrates a simplified timing diagram of an Illustration of a process of constructing an output sample value using a decimate-by-2 FIR discrete time filter, in accordance with examples of the invention.

In other examples that use two or more FIR DTF, the multiple FIR DTF are connected in parallel, each one with the input port connected to the same input signal. Each of the FIR DTFs samples the input signal at the same sampling frequency, but at interleaved time instants. No two FIR DTFs sample the input signal at the same time. FIG. 4 shows an example of input sampling signals for the case with two FIR DTF filters called 'I' and 'Q' respectively.

The output signals of the FIR DTF constitute the baseband output (or intermediate frequency) signals of the receiver, in a similar way to the 'I' and 'Q' signals constitute the baseband output signals in a conventional quadrature receiver.

Each of the two filters shown in FIG. 3 are driven by a set of timing signals as shown in FIG. 4.

Referring now to FIG. 4, a simplified timing diagram 400 illustrates a process of constructing the output sample value of the upper 'I' FIR DTF in FIG. 3, using a decimate-by-2 FIR discrete time filter.

During time period 402, input switch 322a (φ0) and output switches 328b (α1), 328c (α2) are closed. All other switches remain open. This enables top sampling capacitor 326a to be charged from the input voltage 314, whilst the bottom two sampling capacitors 326b and 326c transfer their combined charge to output capacitor (Cout) 320.

During time period 404, input switch 322a (φ0) and output switches 328b (α1), 328c (α2) are opened, whilst reset switches 324b (θ1), 324c (θ2) are closed. All other switches remain open. This enables the bottom two sampling capacitors 326b and 326c to be reset before re-charging, if desired, by removing any memory effects of the charge.

During time period 406, input switch 322b (φ1) is closed. All other switches remain open. This enables the second sampling capacitor 326b to be charged from the input voltage 314.

During time period 408, output capacitor reset switch 318 (β0) is closed. All other switches remain open. This enables the output capacitor 320 to be reset before re-charging, if desired, by removing any memory effects of the charge.

During time period 410, input switch 322c (φ2) together with output switches 328a (α0), 328b (α1) are closed. All other switches remain open. This enables bottom sampling capacitor 326c to be charged from the input voltage 314, whilst the top two sampling capacitors 326a and 326b transfer their combined charge to output capacitor (Cout) 320.

During time period 412, input switch 322c (φ2) and output switches 328a (α0), 328b (α1) are opened, whilst reset switches 324a (θ0), 324b (θ1) are closed. All other switches remain open. This enables the top two sampling capacitors 326a and 326b to be reset before re-charging, if desired, by removing any memory effects of the charge.

During time period 414, input switch 322a (φ0) is closed. All other switches remain open. This enables top sampling capacitor 326a to be charged from the input voltage 314.

During time period 416, output capacitor reset switch 318 (β0) is closed. All other switches remain open. This enables the output capacitor 320 to be reset before re-charging, if desired, by removing any memory effects of the charge.

During time period 418, input switch 322b (φ1) and output switches 328a (α0), 328c (α2) are closed. All other switches remain open. This enables second capacitor 326b to be charged from the input voltage 314, whilst the top and bottom sampling capacitors 326a and 326c transfer their combined charge to output capacitor (Cout) 320.

During time period 420, input switch 322b (φ1) and output switches 328a (α0), 328c (α2) are opened, whilst top and bottom reset switches 324a (θ0), 324c (θ2) are closed. All other switches remain open. This enables the top and bottom sampling capacitors 326a and 326c to be reset before re-charging, if desired, by removing any memory effects of the charge.

This charging, transferring of charge and resetting operation continues as shown, in response to the control of the various switches.

Figure 5:
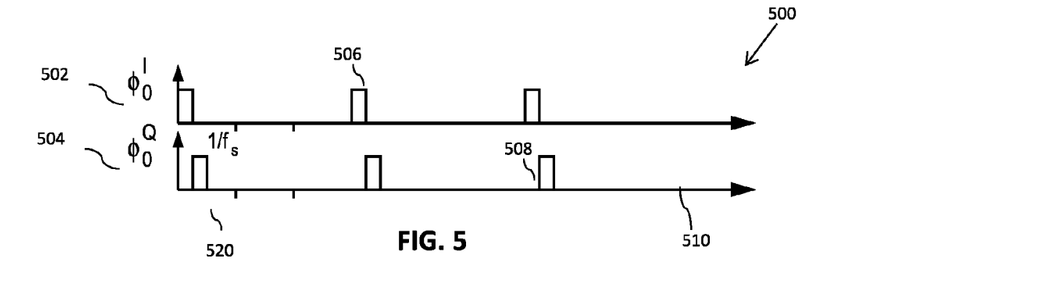
FIG. 5 illustrates a timing diagram of a relative timing between upper ('I') and lower ('Q') filters for the decimate-by-2 FIR DTF in FIG. 3.

Referring now to FIG. 5, a simplified timing diagram 500 illustrates a relative timing between the upper ('I') and the lower ('Q') filter for the decimate-by-2 FIR DTF in FIG. 3. A first timing diagram 502 illustrates the control pulses that close respective input switches (e.g. 322a (φ0) in FIG. 3) in a first quadrature ('I') path. A second timing diagram 504 illustrates the control pulses that close respective input switches (e.g. 342a (φ0) in FIG. 3) in a second quadrature ('Q') path.

As illustrated, all signals of the bottom ('Q') filter must be delayed by ¼ of the input sampling period (1/fs) 520. FIG. 5 only shows the time delay between $\varphi_0^I$ and $\varphi_0^Q$ for simplicity.

Examples of the invention select a sampling frequency (fs) that corresponds to the signal carrier frequency in a similar way to the LO frequency in a conventional direct-conversion receiver. In this manner, the input signal is down-converted to baseband. The sampling period is 1/fs, where fs is the sampling frequency that is comparable to the carrier radio frequency.

It is envisaged that the concepts described herein can be applied to a large set of FIR DTF filter types or configurations. For example, suppose we have a filter with a z-transform of:

$$H1(z) = 1 + z^{\wedge}(-1) + z^{\wedge}(-2) \qquad [3]$$

When this is extrapolated a cascade of 3 (N=3) decimation by 3 (R=3) filters, with respect to the input side clock, results in a z-Transform of:

$$\begin{aligned} H(z) &= H1(z) * H1(z) * H1(z) \qquad [4] \\ &= [1 + z^{\wedge}(-1) + z^{\wedge}(-2)]^{\wedge}3 \\ &= 1 + 3z^{\wedge}(-1) + 6z^{\wedge}(-2) + 7z^{\wedge}(-3) + 6z^{\wedge}(-4) + \\ &\quad 3z^{\wedge}(-5) + z^{\wedge}(-6) \end{aligned}$$

The spectrum of the ideally sampled signal is given in equation [4], with z replaced by the expression in equation [5]:

$$z = e^{j2p\frac{f}{f_s}} \qquad [5]$$

One may choose to implement the filter described by H(z) as the cascade of three filters, each one described by H1(z), or, in some examples, by a single filter directly implementing the full H(z). Thus, the z-Transform is a way of characterizing the input-output characteristic of a discrete time system without reference to how the filter is actually implemented. In the following example we describe a filter whose z-Transform is commonly referred to as the one of a cascade of 3 decimate-by-3 cascaded integrator-comb (CIC) FIR DTF.

A filter implementation of a set of nine unit sampling capacitors does not appear as a cascade of filters, but its transfer function is the same. Decimation is performed at the output in both cases.

Figure 6:
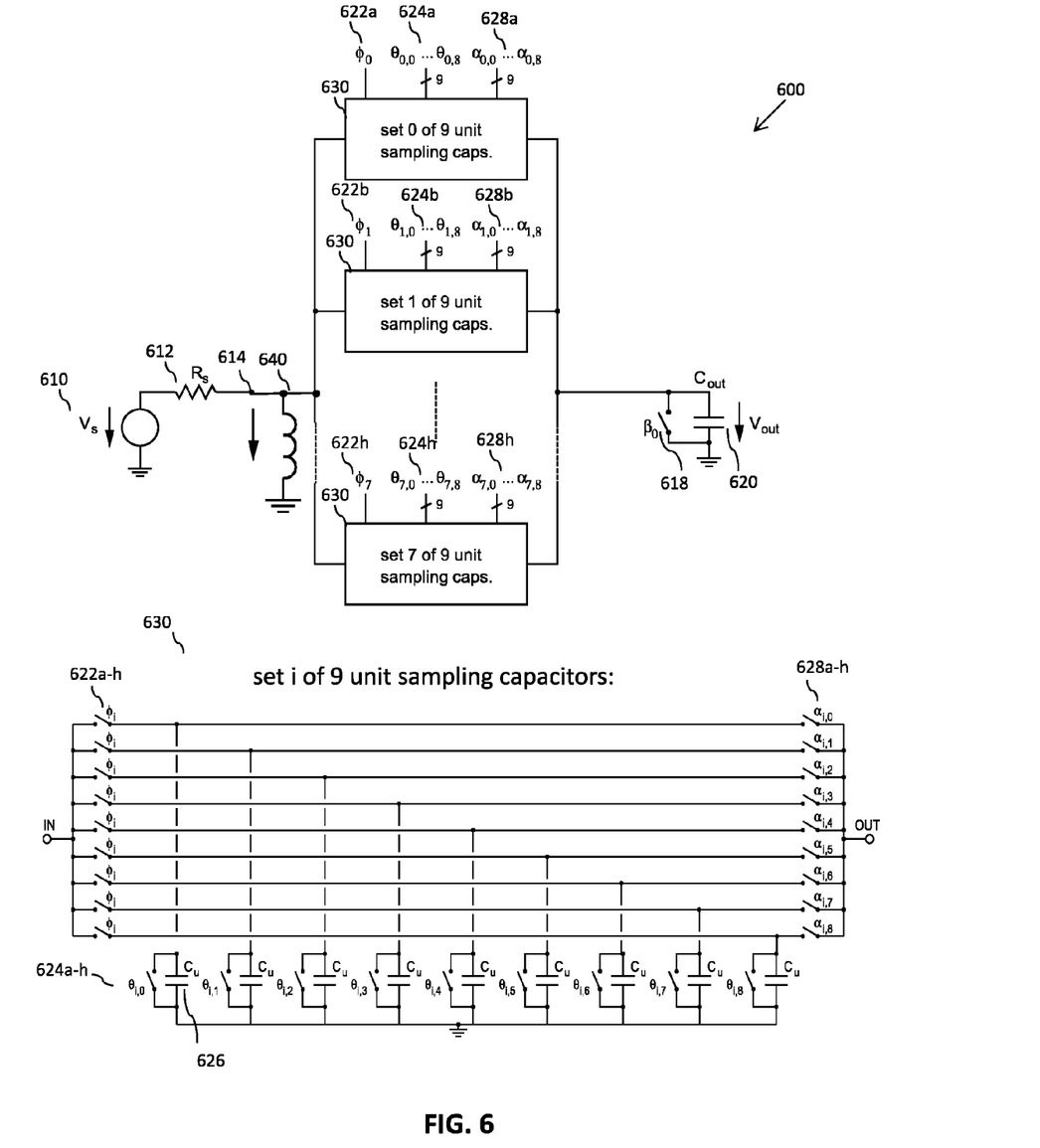
FIG. 6 illustrates a second example of a cascade-by-3 decimate-by-3 cascaded integrator-comb (CIC) FIR DTF, adapted in accordance with example embodiments of the invention.

Referring now to FIG. 6, a second example implementation of a filter with a transfer function corresponding (up to a multiplying constant coefficient) to one of a cascade of 3 decimate-by-3 cascaded integrator-comb (CIC) FIR DTF 600, is illustrated in accordance with example embodiments of the invention.

A further example embodiment of the invention (not shown) includes two of the CIC) FIR DTF filters 600 in parallel, with one replacing the upper 'I' filter of FIG. 3, and the second replacing the lower 'Q' one. As in FIG. 3 the two filters have their inputs connected together and to a shunt inductor 640 (or similar network). For simplicity purposes only, one filter configuration is illustrated in FIG. 6.

The example filter consists of 8 sampling elements, labelled "set 'i' of 9 unit sampling caps" (i=0, . . . , 7) in FIG. 6. Each sampling element in the CIC FIR DTF 600 consists of a set of nine unit sampling capacitors 630. The use of a set of nine unit sampling capacitors 630, instead of just one (as in the decimate-by-2 example of FIG. 3), is motivated by a desire to implement weighting factors to realize more general z-transform filter transfer functions. The sample 'i' weight to be used for constructing an output sample value is determined by the state of the nine output switches $\alpha_{i,k}$, where k=0.8, 628a-h and where the switches are controlled by the control signals with the same name shown in the timing diagram of FIG. 7. As in FIG. 3, the reset switches 624a-h can remove any charge history from the set of nine unit sampling capacitors 630.

Figure 7:
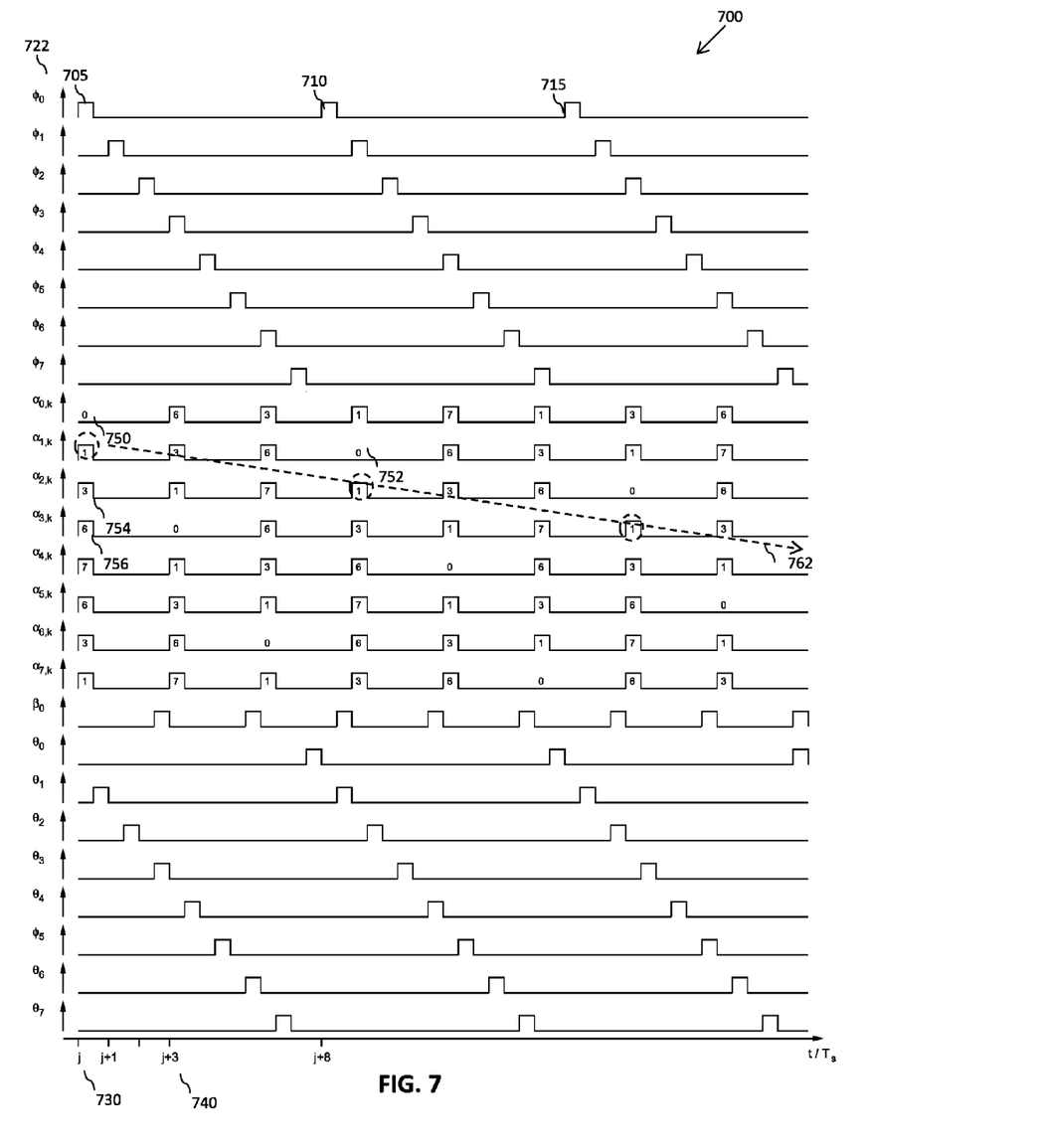
FIG. 7 illustrates a full timing diagram of an implementation of one (CIC N=3, R=3) filter, in accordance with example embodiments of the invention.

In this example, it is proposed that the input signal is sampled on each unit sampling capacitor 626 of one sampling element 630 at a time in a cyclic way as described by the signals $\varphi_0$, $\varphi_7$ of FIG. 7. However, in the same manner as described with respect to FIG. 3 and FIG. 4, when the sampled charge is used to build an output sample value, only a subset of the unit sampling capacitors of some sampling elements are connected to the output node. The number of unit sampling capacitors to be connected depends on the filter transfer function in equation [4] that is to be implemented.

A filter implementation of a set of nine unit sampling capacitors does not appear as a cascade of filters, but its transfer function is the same. Decimation is performed at the output in both cases.

Referring now to FIG. 7, a full timing diagram of an implementation of one (CIC N=3, R=3) filter is illustrated, in accordance with example embodiments of the invention. Thus, a combination of FIG. 6 and FIG. 7, namely the circuit and the timing diagram showing how the circuit control signals are sequenced, provides a full description of an implementation of one filter. Where two filters in parallel are implemented, each one needs a set of all the $\varphi i$, $\alpha i$, k, $\theta i$ and $\beta 0$. The relative timing between equivalent control signals of the two filters should be as exemplified by the $\varphi_0^I$ and $\varphi_0^Q$ on FIG. 5. FIG. 7 also illustrates all reset control signals, noting in the timing diagram $\theta_i = \theta_{i,0} = \theta_{i,1} = \theta_{i,2} = \theta_{i,3} = \theta_{i,4} = \theta_{i,5} = \theta_{i,6} = \theta_{i,7} = \theta_{i,8}$.

In these examples, FIG. 7 shows the control signals, whereas the unit sampling capacitors are the 9 626 inside the 8 sampling elements (labelled 'set 0/ . . . /8 of 9 unit sampling capacitors) in FIG. 6.

In this example an output sample value is constructed every 3 input sampling periods. In FIG. 7, j denotes a point in time at which an output sample needs to be constructed. In particular, at time j the unit sampling capacitors of sampling element 0 are connected to the input for input sampling, 705 (labelled "set 0 of 9 unit sampling caps" in FIG. 6) as determined by $\varphi_0$ being high. At the same time, all other sampling elements (e.g. sampling elements 630 in FIG. 6) are being used to construct an output sample value. From the timing diagram it can be read that, of sampling element 1, 1 unit sampling capacitance is connected to the output ($\alpha_{1,k}$ is high indicating that sampling element 1 is being used). The number in the waveform at time j indicates how many units have to be connected to the output. Similarly we see control signal 754 in FIG. 7 relating to 3 unit sampling capacitors out of the 9 units 626 of sampling element 2, labelled 'set 2 of 9 unit sampling capacitors' in FIG. 6. Similarly we see control signal 756 in FIG. 7 relating to 6 unit sampling capacitors out of the 9 units 626 of sampling element 3, labelled 'set 2 of 9 unit sampling capacitors' in FIG. 6, and so on. Overall we see that the number of unit sampling capacitors used from each sampling element do match the coefficients of the z-Transform [4].

One sampling element may need to be used more than once before a new sample value is stored on each of its unit sampling capacitors. For example, from FIG. 7 we see that a new sampling value is stored on each of the unit sampling capacitors of sampling element 0 at times j, j+8, j+16, . . . . However, the value stored at time j on sampling element 0 is needed to construct an output sample at times j+3 and j+6. At time j+3, 6 unit sampling capacitors out of the 9 units 626 of FIG. 6, are needed and they can be chosen freely among the unit capacitors. However, at time j+6 the unit sampling capacitors used to build the previous sample are discharged and can't be used. Therefore, to construct the output sample at time j+6 we need to select 3 unit sampling capacitors among the ones not used to build a previous output sample. Similarly for each sampling element.

Analysing the timing diagram reveals that, for this particular example, with 9 unit sampling capacitors per sampling element the above constraint can be fulfilled.

At every point in time when an output sample is constructed, e.g. j+3 timing point 740, the timing diagram shows a vertical pattern of the coefficient weight numbers 0, 1, 3, 6, 7, 6, 3, 1 (at time instant j) or a cyclical rotation of them (6, 3, 1, 0, 1, 3, 6, 7 at time j+3 740). Thus the control signals controlling the output switches of the sampling elements are driven in a periodically repeating pattern 762.

A weight factor of zero, e.g. at time point 750 and 752, on an output switch control signal denotes that the unit sampling element to which the control signal refers are not used to construct the output sample value at that particular point in time. In general, in some examples, it is possible to implement a z-Transform where one coefficient is '0'. In that case a '0' in the weight of a waveform for a control signal $\alpha i, k$ will not necessarily mean that the input is being sampled on sampling element i.

Figure 8:
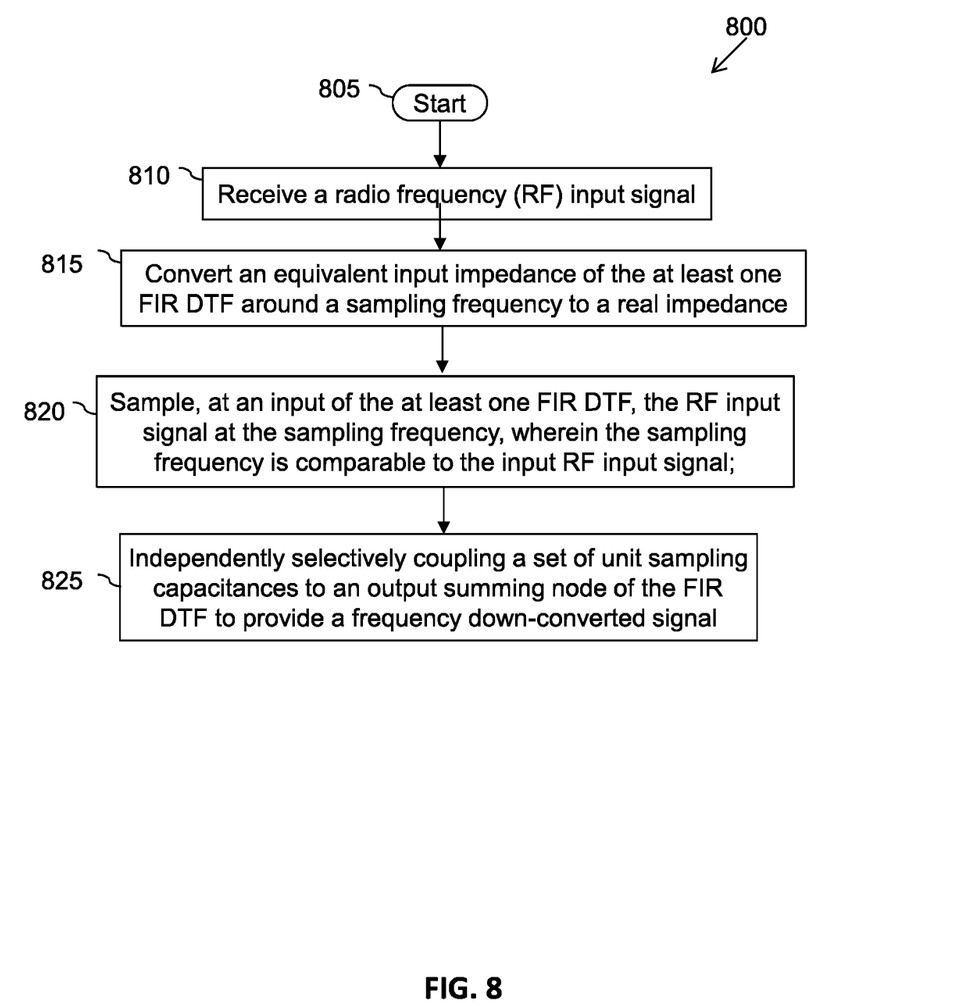
FIG. 8 illustrates a simplified flowchart of a method of receiving and down-converting a radio frequency signal, in accordance with examples of the invention.

Referring now to FIG. 8, a simplified flowchart 800 illustrates a method of down conversion of a radio frequency signal in a communication receiver comprising a finite impulse response, FIR, discrete time filter, DTF that comprises an input coupled to N parallel branches, each branch having a set of input unit sampling capacitances. The flowchart 800 starts at 805, and a radio frequency, RF, input signal is received at 810. At 815, an equivalent input impedance of the at least one FIR DTF around a sampling frequency is converted to a real impedance. At 820, at an input of the at least one FIR DTF, the RF input signal is sampled at the sampling frequency, wherein the sampling frequency is comparable to the input RF input signal. At 825, a set of unit sampling capacitances is independently selectively coupled to an output summing node of the FIR DTF to provide a frequency down-converted signal.

Thus, the example flowchart proposes to transform the input impedance of a class of DTF to a real impedance, and at the same time advantageously limit the bandwidth of the input network to the filter by introducing a reactive component, and use the FIR DTF to down-convert an RF input signal to a baseband or intermediate frequency.

Although examples of the invention have been described in terms of a two-path decimate-by-2 hardware-based DTF design, and a cascade-by 3 (N=3) decimation by 3 (R=3) CIC FIR DTF, it is envisaged that the concepts described herein can be applied to a large range of DTF filter types or configuration or number of paths, for example to address problems of down-converting an RF signal to baseband while providing a real input impedance.

In some examples, some or all of the steps illustrated in the flowchart may be implemented in hardware and/or some or all of the steps illustrated in the flowchart may be implemented in firmware.

In accordance with some examples, it will be appreciated that an equivalent input impedance generated by a network over a limited frequency range can always be approximated by a different network. Therefore, whilst the example embodiments described herein propose a use of a single shunt inductor, in parallel with the input port of the at least one FIR DTF, it is possible to use other multi-component networks that, over a limited frequency range, provide a similar equivalent input impedance.

In particular, it is envisaged that the aforementioned inventive concept can be applied by a semiconductor manufacturer to any integrated circuit comprising a DTF. It is further envisaged that, for example, a semiconductor manufacturer may employ the inventive concept in a design of a stand-alone device, such as an application-specific integrated circuit (ASIC) and/or any other sub-system element.

It will be appreciated that, for clarity purposes, the above description has described embodiments of the invention with reference to different functional units. However, it will be apparent that any suitable distribution of functionality between different functional units may be used without detracting from the invention.

Hence, references to specific functional units are only to be seen as references to suitable means for providing the described functionality, rather than indicative of a strict logical or physical structure or organization.

Aspects of the invention may be implemented in any suitable form including hardware, software, firmware or any combination of these. The invention may optionally be implemented, at least partly, as computer software running on one or more data processors and/or digital signal processors or configurable module components such as FPGA devices. Thus, the elements and components of an embodiment of the invention may be physically, functionally and logically implemented in any suitable way. Indeed, the functionality may be implemented in a single unit, in a plurality of units or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, an improved receiver and a communication unit comprising a receiver having a discrete time filter and method for receiving and down-converting a radio frequency signal have been described, wherein the aforementioned disadvantages with prior art arrangements have been substantially alleviated.

I claim:

1. A radio frequency, RF, communication receiver comprising:
   an input for receiving a RF input signal; and
   at least one finite impulse response, FIR, discrete time filter, DTF, that comprises:
      an input circuit comprising an input shunt reactive component and an input port for sampling the RF input signal at a sampling frequency that is comparable to the RF input signal; and
      N parallel branches, each branch having a set of input unit sampling capacitances, where each unit sampling capacitance is independently selectively coupleable to an output summing node; and
      wherein the input circuit of the at least one FIR DTF is a first stage of the communication receiver and configured to convert an equivalent input impedance of the at least one FIR DTF around the sampling frequency to a real impedance and a combination of the input shunt reactive component and the sampling capacitances of each of the N parallel branches forms a filter that concurrently limits a bandwidth of the input circuit.

2. The communication receiver of claim 1, wherein the at least one FIR DTF is configured to directly perform down conversion of the RF input signal.

3. The communication receiver of claim 1, wherein the input shunt reactive component is a parallel input shunt inductance configured to resonate a reactive part of the equivalent input impedance around the sampling frequency.

4. The communication receiver of claim 1, wherein the input circuit comprises a network of radio frequency components configured to resonate a reactive part of the equivalent input impedance around the sampling frequency.

5. The communication receiver of claim 1, wherein the sampling capacitances of each of the N parallel branches, are linear passive capacitors such that the input signal is sampled across multiple linear passive capacitors.

6. The communication receiver of claim 1, wherein the sampling capacitances of each of the N parallel branches are non-linear Metal-Oxide-Semiconductor, MOS, capacitors.

7. The communication receiver of claim 1, wherein the at least one FIR DTF comprises multiple FIR DTFs connected in parallel each one with their respective input port connected to receive the same RF input signal.

8. The communication receiver of claim 7, wherein the multiple FIR DTFs are configured to filter samples of the same RF input signal at the same sampling frequency, but at interleaved time instants.

9. The communication receiver of claim 8, wherein the multiple FIR DTFs comprise two FIR DTFs configured to act on quadrature representations of the RF input signal.

10. A radio frequency, RF, communication unit comprising a receiver having:
   an input for receiving a RF input signal; and
   at least one finite impulse response, FIR, discrete time filter, DTF, that comprises:
      an input circuit comprising an input shunt reactive component and an input port for sampling the RF input signal at a sampling frequency that is comparable to the RF input signal; and
      N parallel branches, each branch having a set of input unit sampling capacitances, where each unit sampling capacitance is independently selectively coupleable to an output summing node;
      wherein the input circuit of the at least one FIR DTF is a first stage of the receiver and configured to convert an equivalent input impedance of the at least one FIR DTF around the sampling frequency to a real impedance and a combination of the input shunt reactive component and the sampling capacitances of each of the N parallel branches forms a filter that concurrently limits a bandwidth of the input circuit.

11. The communication unit of claim 10, wherein the at least one FIR DTF is configured to directly perform down conversion of the input RF signal.

12. The communication unit of claim 10, wherein the input shunt reactive component is a parallel input shunt inductance configured to resonate a reactive part of the equivalent input impedance around the sampling frequency.

13. The communication unit of claim 10, wherein the input circuit comprises a network of radio frequency components configured to resonate a reactive part of the equivalent input impedance around the sampling frequency.

14. The communication unit of claim 10, wherein the sampling capacitances of each of the N parallel branches, are at least one from a group of: linear passive capacitors such that the input signal is sampled across multiple linear passive capacitors, non-linear Metal-Oxide-Semiconductor, MOS, capacitors.

15. The communication unit of claim 10, wherein the at least one FIR DTF comprises multiple FIR DTFs connected in parallel each one with their respective input port connected to receive the same RF input signal.

16. The communication unit of claim 15, wherein the multiple FIR DTFs are configured to filter samples of the same RF input signal at the same sampling frequency, but at interleaved time instants.

17. The communication unit of claim 16, wherein the multiple FIR DTFs comprise two FIR DTFs configured to act on quadrature representations of the RF input signal.

18. A method of down conversion of a radio frequency signal in a radio frequency, RF, communication receiver comprising at least one finite impulse response, FIR, discrete time filter, DTF that comprises an input coupled to N parallel branches, each branch having a set of input unit sampling capacitances, the method comprising:
   receiving a RF input signal;
   converting an equivalent input impedance of the at least one FIR DTF around a sampling frequency to a real impedance;
   sampling, at the input of the at least one FIR DTF, configured as a first stage of the communication receiver comprising an input shunt reactive component as part of an input circuit, the RF input signal at the sampling frequency, wherein the sampling frequency is comparable to the RF input signal; and
   independently selectively coupling a set of unit sampling capacitances to an output summing node of the at least one FIR DTF to provide a frequency down-converted signal, such that a combination of the input shunt reactive component and the set of input unit sampling capacitances forms a filter that concurrently limits a bandwidth of the input circuit.

19. The method of claim 18 further comprising performing down conversion of the input RF signal directly by the at least one FIR DTF.

20. The method of claim 18 further comprising resonating a reactive part of the equivalent input impedance around the sampling frequency.

* * * * *